(12) United States Patent
Nagai et al.

(10) Patent No.: US 11,664,815 B2
(45) Date of Patent: May 30, 2023

(54) DIGITAL FILTER, A/D CONVERTER, SENSOR PROCESSING CIRCUIT, AND SENSOR SYSTEM

(71) Applicant: Panasonic Intellectual Property Management Co., Ltd., Osaka (JP)

(72) Inventors: Masaaki Nagai, Osaka (JP); Hiroki Yoshino, Nara (JP); Junji Nakatsuka, Osaka (JP); Jun'ichi Naka, Osaka (JP); Koji Obata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 5 days.

(21) Appl. No.: 17/442,303

(22) PCT Filed: Feb. 28, 2020

(86) PCT No.: PCT/JP2020/008268
§ 371 (c)(1),
(2) Date: Sep. 23, 2021

(87) PCT Pub. No.: WO2020/195535
PCT Pub. Date: Oct. 1, 2020

(65) Prior Publication Data
US 2022/0158652 A1   May 19, 2022

(30) Foreign Application Priority Data
Mar. 28, 2019   (JP) .............................. JP2019-065092

(51) Int. Cl.
*H03M 3/00*   (2006.01)
(52) U.S. Cl.
CPC ........... *H03M 3/438* (2013.01); *H03M 3/458* (2013.01)

(58) Field of Classification Search
CPC ....... H03M 3/438; H03M 3/458; H03M 3/462
(Continued)

(56) References Cited

U.S. PATENT DOCUMENTS 5,652,585 A * 7/1997 Leung .................... H03M 3/462
                                                    341/143
7,289,053 B2 * 10/2007 Bunin .................... H03M 1/145
                                                    341/155
(Continued)

FOREIGN PATENT DOCUMENTS

JP   2017-147712 A   8/2017
JP   2018-152839 A   9/2018

OTHER PUBLICATIONS

Chae Youngcheol et al., "A 2.1 M Pixels, 120 Frame/s CMOS Image Sensor With Column-Parallel ΔΣ ADC Architecture," IEEE Jounal of Solid-State Circuits, Jan. 2011, vol. 46, No. 1, pp. 236-247, FIG.3(a), FIG.6(a).
(Continued)

*Primary Examiner* — Jean B Jeanglaude
(74) *Attorney, Agent, or Firm* — McDermott Will & Emery LLP

(57) ABSTRACT

A digital filter is used in an A/D converter and includes a first filter and second filter. The first filter outputs first digital data by performing filter processing on output of an A/D conversion unit included in the A/D converter. The second filter outputs second digital data by performing filter processing on the output of the A/D conversion unit. The second digital data has either a lower resolution or a smaller effective number of bits than the first digital data does. The second filter outputs the second digital data before the first filter outputs the first digital data.

10 Claims, 6 Drawing Sheets

(58) Field of Classification Search
USPC .......................................................... 341/143
See application file for complete search history.

(56) References Cited

U.S. PATENT DOCUMENTS

| | | | | |
|---|---|---|---|---|
| 9,525,429 | B2* | 12/2016 | Kinyua | ................... H03M 1/74 |
| 9,742,429 | B1 | 8/2017 | Inamdar et al. | |
| 10,122,373 | B2* | 11/2018 | Kim | ................... H03M 1/0604 |
| 2006/0267812 | A1* | 11/2006 | Bunin | ................... H03M 1/06 |
| | | | | 341/120 |
| 2015/0229323 | A1* | 8/2015 | Kinyua | ................... H03H 11/04 |
| | | | | 327/552 |
| 2016/0006451 | A1* | 1/2016 | Kinyua | ................... H03M 1/74 |
| | | | | 327/552 |
| 2018/0160066 | A1 | 6/2018 | Matsuzawa et al. | |
| 2018/0287623 | A1* | 10/2018 | Kim | ................... H03M 1/0609 |

OTHER PUBLICATIONS

International Search Report issued in International Patent Applicaiton No. PCT/JP2020/008268, dated May 26, 2020; with partial English translation.

\* cited by examiner

DIGITAL FILTER, A/D CONVERTER, SENSOR PROCESSING CIRCUIT, AND SENSOR SYSTEM

CROSS-REFERENCE OF RELATED APPLICATIONS

This application is the U.S. National Phase under 35 U.S.C. § 371 of International Patent Application No. PCT/JP2020/008268, filed on Feb. 28, 2020, which in turn claims the benefit of Japanese Application No. 2019-065092, filed on Mar. 28, 2019, the entire disclosures of which Applications are incorporated by reference herein.

TECHNICAL FIELD

The present disclosure generally relates to a digital filter, an A/D converter, a sensor processing circuit, and a sensor system, and more particularly relates to a digital filter for performing filter processing on the output of an A/D conversion unit that digitally converts an analog signal, an A/D converter, a sensor processing circuit, and a sensor system.

BACKGROUND ART

An A/D converter including a digital filter has been known in the pertinent art (see, for example, Patent Literature 1). Patent Literature 1 discloses a noise-shaping A/D converter designed to achieve as high a resolution as that of a ΔΣ A/D converter while maintaining the power consumption as low as that of a successive approximation register (SAR) A/D converter.

The noise-shaping SAR A/D converter of Patent Literature 1 has a configuration in which an integration circuit is provided as an additional constituent element for a normal SAR A/D converter. After a successive comparison operation has been performed to the least significant bit (LSB), the residual voltages of a capacitive digital-to-analog converter (DAC) are subjected to an integration operation, and the integrated value thus obtained is fed back when sampling is performed next time, thus obtaining a noise-shaping characteristic.

To increase the accuracy of the output data of an A/D converter, it takes a long time to have digital conversion processing done, thus causing an increase in latency.

CITATION LIST

Patent Literature

Patent Literature 1: JP 2017-147712 A

SUMMARY OF INVENTION

In view of the foregoing background, it is therefore an object of the present disclosure to provide a digital filter, an A/D converter, a sensor processing circuit, and a sensor system, all of which contribute to allowing the output data to have higher accuracy and lower latency.

A digital filter according to an aspect of the present disclosure is used in an A/D converter and includes a first filter and second filter. The first filter outputs first digital data by performing filter processing on output of an A/D conversion unit included in the A/D converter. The second filter outputs second digital data by performing filter processing on the output of the A/D conversion unit. The second digital data has either a lower resolution or a smaller effective number of bits than the first digital data does. The second filter outputs the second digital data before the first filter outputs the first digital data.

An A/D converter according to another aspect of the present disclosure includes: the digital filter described above; and the A/D conversion unit.

A sensor processing circuit according to still another aspect of the present disclosure includes the A/D converter described above. The A/D converter converts an output of a sensor into digital data and outputs the digital data to a control circuit.

A sensor system according to yet another aspect of the present disclosure includes: the sensor processing circuit described above; and the sensor.

DESCRIPTION OF EMBODIMENTS

Note that the embodiment and its variations to be described below are only examples of the present disclosure and should not be construed as limiting. Rather, the exemplary embodiment and its variations may be readily modified in various manners depending on a design choice or any other factor without departing from a true spirit and scope of the present disclosure.

Embodiment (1) Configuration

Figure 1:
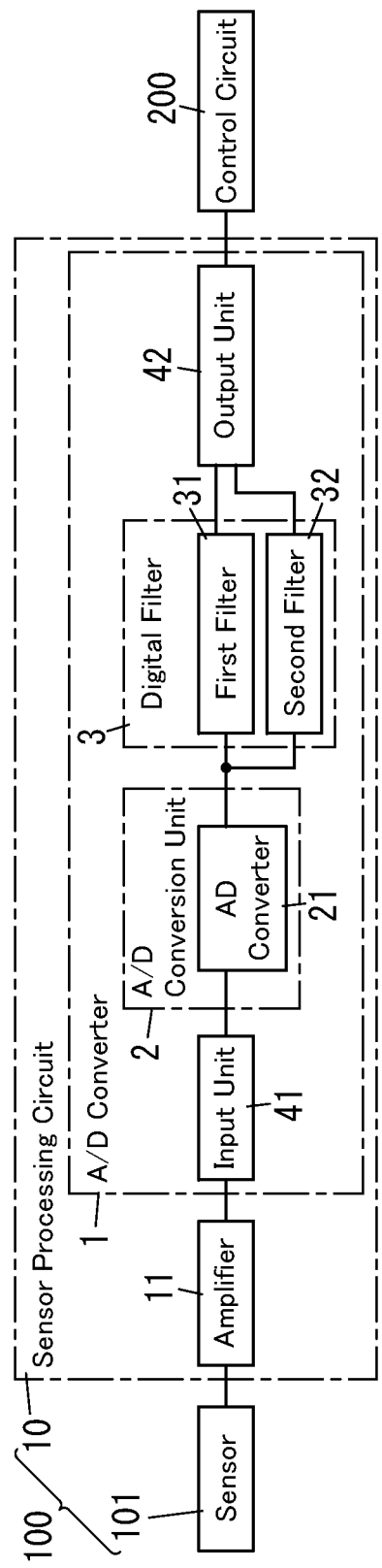
FIG. 1 is a block diagram of a sensor system including a digital filter and an A/D converter according to an exemplary embodiment of the present disclosure.

FIG. 1 is a block diagram of a sensor system 100 including a digital filter 3 and an A/D (analog-to-digital) converter 1 according to an exemplary embodiment.

The A/D converter 1 according to this embodiment is used in an analog front end (sensor processing circuit 10) of the sensor system 100 and is configured to convert an analog signal supplied from a sensor 101 into digital data.

The sensor processing circuit 10 includes the A/D converter 1 and an amplifier 11, performs signal processing on a signal supplied from the sensor 101, and outputs the signal thus processed to a control circuit 200.

The sensor system 100 includes the sensor 101 and the sensor processing circuit 10.

The sensor 101 is configured to detect a physical quantity of a target of measurement or the magnitude of variation thereof. The sensor 101 outputs an analog signal, of which the amplitude is represented by a voltage value based on the result of the detection, to the sensor processing circuit 10. That is to say, the sensor 101 functions as a signal output unit for outputting an analog signal. The sensor processing circuit 10 converts the analog signal supplied from the sensor 101 into digital data and outputs the digital data to the control circuit 200.

In this embodiment, the sensor system 100 is applicable, for example, to moving vehicles such as automobiles. In that case, the sensor 101 may be implemented as an acceleration sensor for detecting the acceleration of a moving vehicle as the target of measurement. The control circuit 200 receiving the result of detection by the sensor 101 may be implemented as an electronic control unit (ECU) as a piece of onboard equipment installed in an automobile. However, this is only an example and should not be construed as limiting. The sensor 101 does not have to be an acceleration sensor but may also be a gyrosensor, a pressure sensor, or a motion sensor, for example. Also, the sensor system 100 is also applicable to a different type of device, instead of a moving vehicle such as an automobile.

The sensor processing circuit 10 is an analog front end for performing signal processing on an analog signal supplied from the sensor 101 and outputting the resultant data to the control circuit 200.

The sensor processing circuit 10 includes the A/D converter 1 and the amplifier 11.

The amplifier 11 is configured to amplify the analog signal supplied from the sensor 101. The amplifier 11 receives the analog signal as an output signal of the sensor 101. The amplifier 11 amplifies the amplitude of the input analog signal by a predetermined amplification factor and outputs the signal with the amplified amplitude to the A/D converter 1 connected thereto to follow the amplifier 11.

The A/D converter 1 includes an A/D conversion unit 2, a digital filter 3, an input unit 41, and an output unit 42. The A/D converter 1 converts the amplitude of the analog signal into digital data having a prescribed number of bits and outputs the digital data thus obtained to the control circuit 200. In this embodiment, the A/D converter 1 may be configured to, for example, output 21-bit digital data. Note that the number of bits of the digital data output by the A/D converter 1 does not have to be 21 bits.

The input unit 41 is electrically connected to the amplifier 11. The input unit 41 receives, via the amplifier 11, the analog signal as an output signal of the sensor 101.

The A/D conversion unit 2 includes an A/D converter 21.

The A/D converter 21 is implemented as a $\Delta\Sigma$ A/D converter. The A/D converter 21 includes a subtractor, an integrator, a quantizer, and a D/A converter and performs $\Delta\Sigma$ modulation. The subtractor is implemented as a differential amplifier. The subtractor receives the analog signal supplied from the sensor 101 and a reference signal. The subtractor subtracts the reference signal from the analog signal. The integrator calculates a cumulative value by adding together the calculation results obtained by the subtractor. The quantizer determines a 1-bit digital value by comparing the calculation result obtained by the integrator with the reference signal. The result thus obtained by the quantizer is output to the digital filter 3 arranged to follow the A/D converter 21 and to the D/A converter. The D/A converter is implemented as a 1-bit D/A converter and determines, based on the result obtained by the quantizer, the reference signal to be fed back to the subtractor.

Optionally, the A/D converter 21 may also be implemented as a high-order $\Delta\Sigma$ A/D converter including a plurality of subtractors and a plurality of integrators. The higher the order of the A/D converter 21 is, the higher the frequency range, in which the quantization noise is generated, may be. This allows the conversion accuracy to be improved.

The digital filter 3 performs filter processing on the output of the A/D conversion unit 2. The digital filter 3 includes a first filter 31 and a second filter 32.

The first filter 31 and the second filter 32 are connected in parallel. The first filter 31 and the second filter 32 each receive the 1-bit digital data as the output data of the A/D conversion unit 2.

The first filter 31 and the second filter 32 each perform filter processing on the output of the A/D conversion unit 2. The first filter 31 and second filter 32 each have a band limitation function and a decimation function as their functions for the filter processing. In other words, the first filter 31 and the second filter 32 each include a low-pass filter and a decimation filter. The output of the A/D converter 21 implemented as a $\Delta\Sigma$ A/D converter includes RF noise generated by noise shaping of a quantization noise and has a data rate higher than its original sampling frequency as a result of over sampling. Thus, the first filter 31 and second filter 32 reduce the RF noise by using the band limitation function and also lowers the data rate by using the decimation function.

The first filter 31 and second filter 32 each generate multi-bit digital data by performing filter processing on the output of the A/D conversion unit 2. The second filter 32 has a lower resolution than the first filter 31. In this embodiment, the first filter 31 generates 21-bit digital data (first digital data) by performing filter processing on the output of the A/D conversion unit 2. The second filter 32 generates 3-bit digital data (second digital data) by performing filter processing on the output of the A/D conversion unit 2. The second digital data generated by the second filter 32 corresponds to high-order bits of the first digital data generated by the first filter 31.

The output unit 42 has a plurality of output ports and outputs the first digital data and the second digital data to the control circuit 200. The output unit 42 has twenty-one output ports provided for the digital data of 21 bits, respectively. When outputting the first digital data of 21 bits, the output unit 42 outputs the first digital data by using all the twenty-one output ports. Also, the second digital data corresponds to the 3 most significant bits of the first digital data. Thus, when outputting the second digital data of 3 bits, the output unit 42 outputs the second digital data by using three output ports, corresponding to the 3 most significant bits of the first digital data, out of the twenty-one output ports.

In this case, the second filter 32 generates digital data having a lower resolution than the digital data generated by the first filter 31. Thus, the filter processing performed by the second filter 32 requires a shorter time than the filter processing performed by the first filter 31. Therefore, the second filter 32 generates the second digital data before the first filter 31 generates the first digital data. The output unit 42 outputs the second digital data generated earlier and then outputs the first digital data. That is to say, the latency (time delay) of the second digital data is lower than the latency of the first digital data. Meanwhile, the first digital data to be output later than the second digital data has a higher resolution than the second digital data.

(Exemplary Operation)

Figure 2:
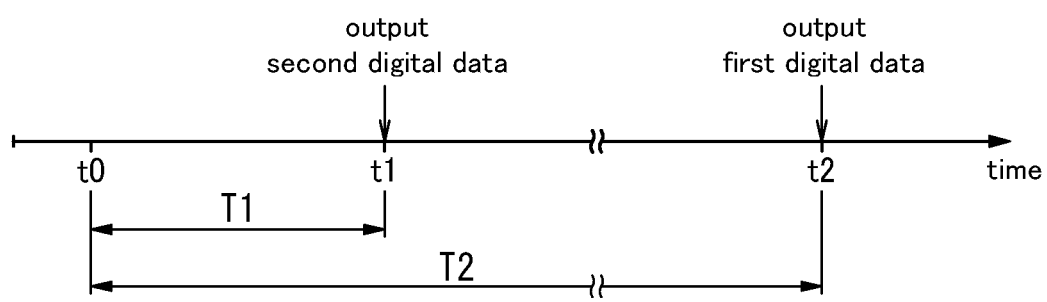
FIG. 2 illustrates how the A/D converter operates.

An exemplary operation of the A/D converter 1 according to this embodiment will be described with reference to FIG. 2.

In the following description, it will be described how to perform A/D conversion processing on the amplitude of an analog signal provided to the input unit 41.

The first filter 31 and the second filter 32 are connected in parallel and start performing the filter processing substantially simultaneously. The second filter 32 generates digital data, of which the resolution is lower than that of the digital data generated by the first filter 31. Therefore, at a point in time t1, the second filter 32 finishes generating the second digital data earlier than the first filter 31. The output unit 42 outputs the second digital data generated by the second filter 32 to the control circuit 200. Note that strictly speaking, a time lag is caused by, for example, the signal processing performed by the output unit 42 between the point in time when the second filter 32 has generated the second digital data and the point in time when the output unit 42 outputs the second digital data. However, the time lag is insignificant, and therefore, ignored in this example.

Thereafter, at a point in time t2, the first filter 31 finishes generating the first digital data. The output unit 42 outputs the first digital data generated by the first filter 31 to the control circuit 200. Note that strictly speaking, a time lag is caused by, for example, the signal processing performed by the output unit 42 between the point in time when the first filter 31 has generated the first digital data and the point in time when the output unit 42 outputs the first digital data. However, the time lag is insignificant, and therefore, ignored in this example.

As can be seen, the A/D converter 1 according to this embodiment outputs the second digital data having the lower resolution prior to the first digital data having the higher resolution. That is to say, the second digital data has a lower resolution, but causes lower latency, than the first digital data. This allows the A/D converter 1 according to this embodiment to output the first digital data having the higher resolution and the second digital data causing the lower latency, thus contributing to allowing the output data to have a higher resolution and lower latency.

In addition, the control circuit 200 may receive the second digital data having the lower resolution before receiving the first digital data having the higher resolution. This allows the control circuit 200 to quickly detect an abnormal state where the analog signal provided by the sensor 101 has an amplitude greater than the threshold value. Thus, the control circuit 200 may more quickly perform the operation to be performed when any abnormal state has arisen. That is to say, this contributes to increasing the responsivity of the control circuit 200 from the point in time when the abnormal state has arisen to the point in time when the control circuit 200 starts performing its operation to cope with the abnormality.

In addition, the control circuit 200 may receive the first digital data having the higher resolution separately from the second digital data, and therefore, may control the target of control accurately based on the first digital data.

(Variations)

Next, variations of the A/D converter 1 according to the exemplary embodiment will be described.

(First Variation)

Figure 3:
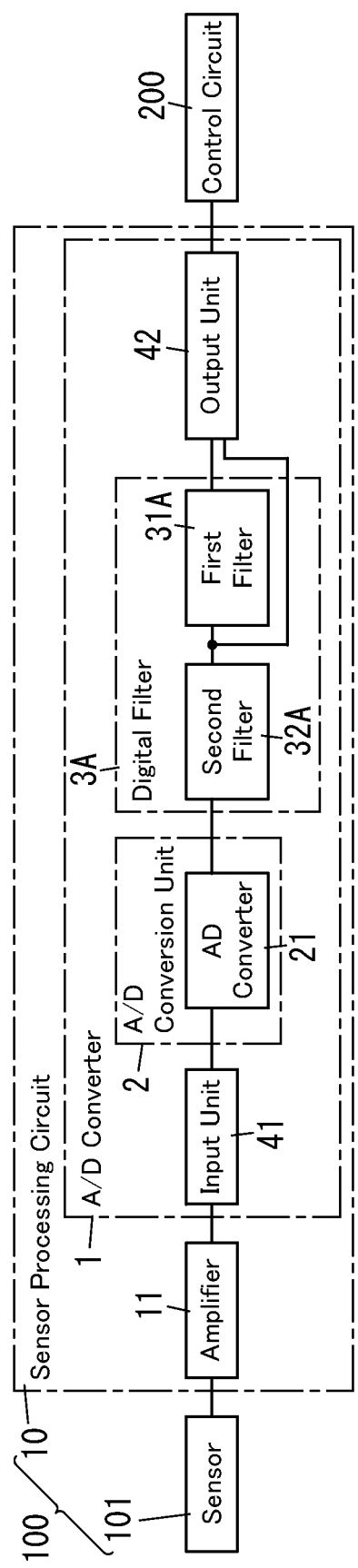
FIG. 3 is a block diagram of a sensor system including a digital filter according to a first variation of the exemplary embodiment of the present disclosure.

An A/D converter 1 according to a first variation will be described with reference to FIG. 3.

Any constituent element of the first variation, having the same function as a counterpart of the A/D converter 1 of the embodiment described above, will be designated by the same reference numeral as that counterpart's, and description thereof will be omitted as appropriate herein.

The A/D converter 1 according to this variation includes a digital filter 3A including a first filter 31A and a second filter 32A.

The first filter 31A and the second filter 32A are connected in series. The second filter 32A is arranged to precede the first filter 31A and receives 1-bit digital data from the A/D conversion unit 2.

The second filter 32A generates second digital data of 3 bits by performing filter processing on the output of the A/D conversion unit 2. The second filter 32A outputs the second digital data of 3 bits to the first filter 31A and the output unit 42.

The output unit 42 outputs the second digital data, generated by the second filter 32A, to the control circuit 200.

Also, the first filter 31A generates first digital data of 21 bits by performing filter processing on the second digital data of 3 bits supplied from the second filter 32A. That is to say, in this variation, the second filter 32A performs primary filter processing on the output of the A/D conversion unit 2 and the first filter 31A performs secondary filter processing on the output of the A/D conversion unit 2. As a result of the primary filter processing by the second filter 32A, digital data consisting of the 3 high-order bits is generated. As a result of the secondary filter processing by the first filter 31A, digital data consisting of the 18 low-order bits is generated. The first filter 31A outputs first digital data of 21 bits, which is the combination of the 3 high-order bits of the digital data generated through the primary filter processing and the 18 low-order bits of the digital data generated through the secondary filter processing, to the output unit 42.

The output unit 42 outputs the first digital data, generated by the first filter 31A, to the control circuit 200.

As can be seen, in this variation, the output of the A/D conversion unit 2 is subjected to the primary filter processing by the second filter 32A and then subjected to the secondary filter processing by the first filter 31A. Consequently, the second digital data is generated, and output to the control circuit 200, earlier than the first digital data. That is to say, the second digital data has a lower resolution, but causes lower latency, than the first digital data. This allows the A/D converter 1 according to this variation to output the first digital data having the higher resolution and the second digital data causing the lower latency, thus contributing to allowing the output data to have a higher resolution and lower latency at a time.

In addition, according to this variation, the first filter 31A and the second filter 32A are connected in series such that the second filter 32A performs the primary filter processing and the first filter 31A performs the secondary filter processing. This allows reducing, compared to the configuration in which the first filter 31 and the second filter 32 are connected in parallel (see FIG. 1), the size of the first filter 31A.

(Other Variations)

In the examples described above, the second digital data generated by the second filter 32 (32A) has a lower resolution than the first digital data generated by the first filter 31 (31A). However, this is only an example and should not be construed as limiting.

Optionally, the first filter 31 (31A) and the second filter 32 (32A) may be configured such that the second digital data generated by the second filter 32 (32A) has a smaller effective number of bits than the first digital data generated by the first filter 31 (31A). As used herein, the "effective number of bits" is obtained as the ratio of the oversampling rate of the A/D converter 21 implemented as a $\Delta\Sigma$ A/D converter to the output data rate of the first filter 31 (31A) or the second filter 32 (32A), i.e., as a decimation ratio. The digital data generated by the second filter 32 (32A) has a smaller effective number of bits than the digital data generated by the first filter 31 (31A). Thus, the second filter 32 (32A) requires a shorter filter processing time than the first filter 31 (31A) does. Consequently, the second digital data is generated, and output to the control circuit 200, earlier than the first digital data. That is to say, the latency of the second digital data is lower than the latency of the first digital data.

Also, although the digital filter 3 includes the first filter 31 (31A) and the second filter 32 (32A) in the examples described above, the digital filter 3 may include a larger number of filters.

Figure 4:
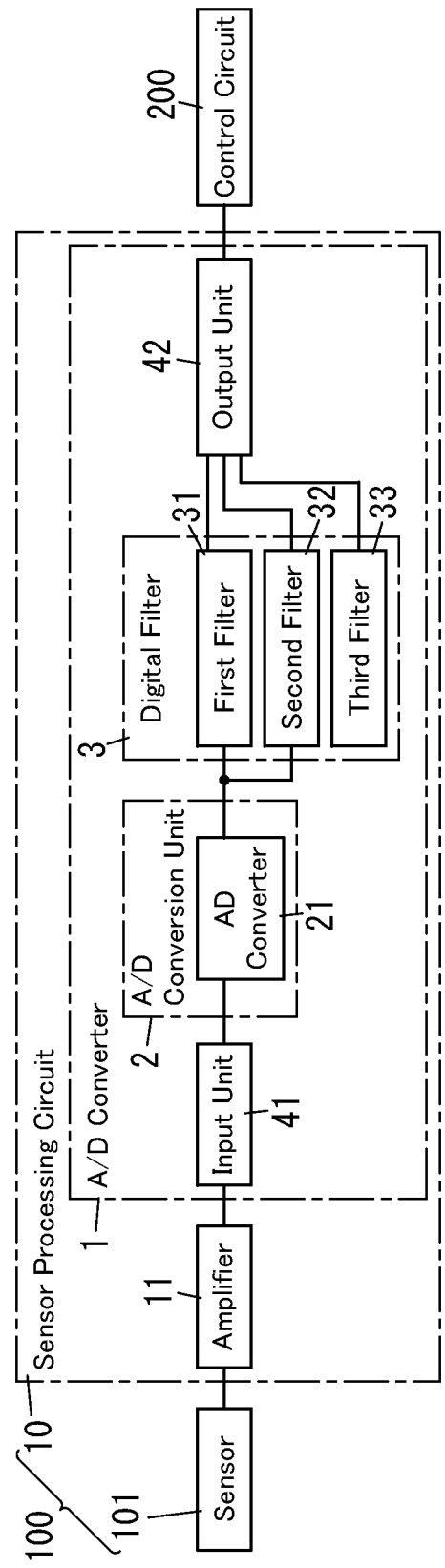
FIG. 4 is a block diagram of a sensor system including a digital filter according to another variation of the exemplary embodiment of the present disclosure.

As shown in FIG. 4, the digital filter 3 may further include a third filter 33. In the example illustrated in FIG. 4, the digital filter 3 includes the first filter 31, the second filter 32, and the third filter 33, which are connected in parallel. The third filter 33 generates multi-bit digital data by performing filter processing on the output of the A/D conversion unit 2. For example, the third digital data output by the third filter 33 may have a lower resolution than the first digital data generated by the first filter 31 and a higher resolution than the second digital data generated by the second filter 32. Also, the third digital data output by the third filter 33 may cause lower latency than the first digital data generated by the first filter 31 and higher latency than the second digital data output by the second filter 32.

Figure 5:
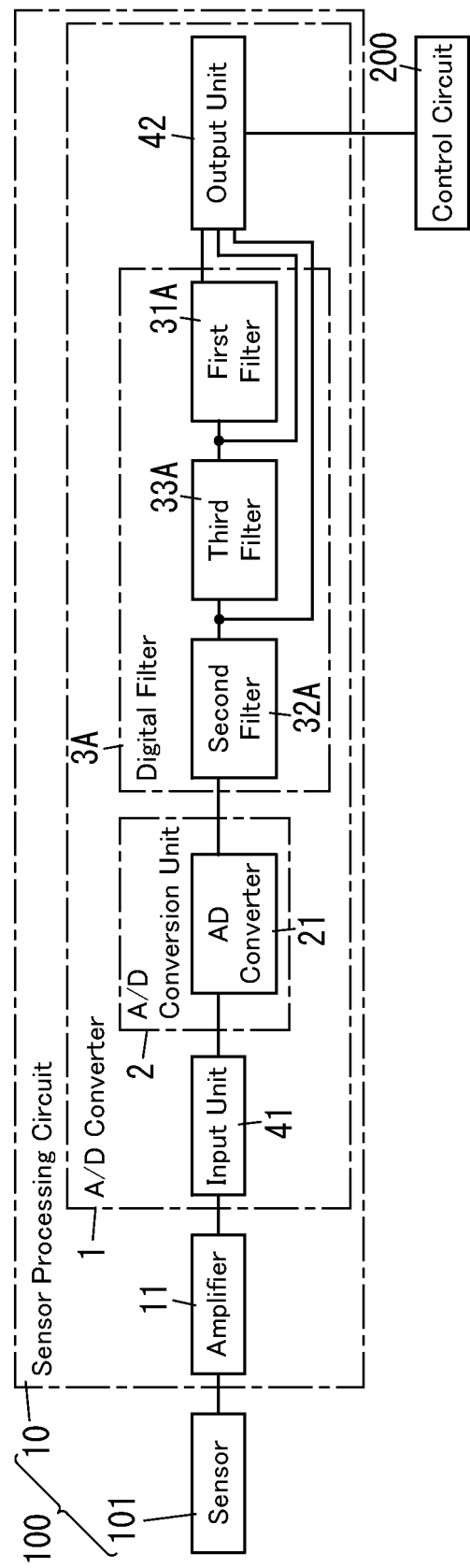
FIG. 5 is a block diagram of a sensor system including a digital filter according to still another variation of the exemplary embodiment of the present disclosure.

As shown in FIG. 5, the digital filter 3A may further include a third filter 33A. In the example illustrated in FIG. 5, the digital filter 3A includes the first filter 31A, the second filter 32A, and the third filter 33A, which are connected in series. The third filter 33A is provided to follow the second filter 32A and to precede the first filter 31A. The output of the A/D conversion unit 2 is subjected to primary filter processing by the second filter 32A, secondary filter processing by the third filter 33A, and then tertiary filter processing by the first filter 31A. Therefore, the third digital data output by the third filter 33A may have a lower resolution than the first digital data generated by the first filter 31A and a higher resolution than the second digital data generated by the second filter 32A. Also, the third digital data output by the third filter 33A may cause lower latency than the first digital data generated by the first filter 31A and higher latency than the second digital data output by the second filter 32A.

Furthermore, in the examples described above, the A/D conversion unit 2 is configured to include only the A/D converter 21 implemented as a ΔΣ A/D converter. However, this is only an example and should not be construed as limiting.

Figure 6:
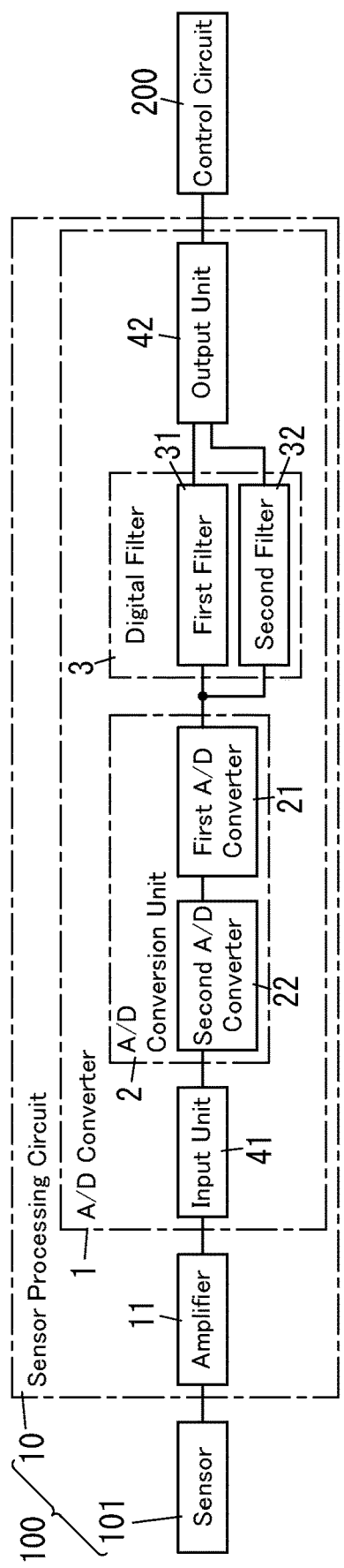
FIG. 6 is a block diagram of a sensor system including an A/D converter according to yet another variation of the exemplary embodiment of the present disclosure.

As shown in FIG. 6, the A/D conversion unit 2 may include the A/D converter 21 (hereinafter referred to as a "first A/D converter 21") and a second A/D converter 22 provided to precede the first A/D converter 21. The second A/D converter 22 is implemented as a successive approximation register (SAR) A/D converter. That is to say, the A/D converter 1 may be implemented as a hybrid A/D converter having a plurality of A/D conversion architectures.

The second A/D converter 22 includes a capacitive digital-to-analog (D/A) converter. The capacitive D/A converter includes a plurality of capacitors (capacitive elements). Each of the capacitors has one terminal thereof electrically connected to the input unit 41 and the other terminal thereof selectively electrically connected to either a first voltage source or a second voltage source. The first voltage source and the second voltage source have mutually different output voltages.

The second A/D converter 22 successively and repeatedly performs the operation of comparing the amplitude voltage of the analog signal with the voltage generated by the capacitive D/A converter, thereby generating multi-bit digital data. Specifically, the A/D conversion unit 2 includes a comparator and a successive approximation register control circuit. The comparator compares the input voltage received by the input unit 41 (i.e., the amplitude of the analog signal) with the voltage generated by the capacitive D/A converter (reference voltage for comparison). Then, the successive approximation register control circuit generates, based on the result of comparison made by the comparator, a successive comparison control signal of the next bit, and outputs the control signal to the capacitive D/A converter. In accordance with the successive comparison control signal, each capacitor of the capacitive D/A converter has the other terminal thereof selectively electrically connected to either the first voltage source or the second voltage source. The second A/D converter 22 performs this successive comparison operation repeatedly, thereby generating multi-bit digital data.

The first A/D converter 21 receives the residual voltage of the capacitive D/A converter (corresponding to a quantization noise) after the successive comparison operation has been performed by the second A/D converter 22.

In this variation, digital data, of which the high-order bits are the digital data generated by the second A/D converter 22 and the low-order bits are the digital data generated by the first A/D converter 21 and the digital filter 3, is output from the output unit 42 to the control circuit 200.

The second A/D converter 22 does not have to be implemented as a successive approximation register A/D converter but may also be implemented as an A/D converter having any other A/D conversion architecture (such as a flash A/D converter).

Furthermore, in the examples described above, the digital filter 3 is one of constituent elements of the A/D converter 1. However, the digital filter 3 may be a constituent element provided outside of the A/D converter 1.

(Recapitulation)

A digital filter (3) according to a first aspect is used in an A/D converter (1) and includes a first filter (31, 31A) and second filter (32, 32A). The first filter (31, 31A) outputs first digital data by performing filter processing on output of an A/D conversion unit (2) included in the A/D converter (1). The second filter (32, 32A) outputs second digital data by performing filter processing on the output of the A/D conversion unit (2). The second digital data has either a lower resolution or a smaller effective number of bits than the first digital data does. The second filter (32, 32A) outputs the second digital data before the first filter (31, 31A) outputs the first digital data.

This aspect allows the digital filter (3) to output first digital data having either the higher resolution or the larger effective number of bits and second digital data having either the lower resolution or the smaller effective number of bits, thus contributing to allowing the output data to have higher accuracy and lower latency.

In a digital filter (3) according to a second aspect, which may be implemented in conjunction with the first aspect, the A/D conversion unit (2) includes a ΔΣ A/D converter (A/D converter 21). Each of the first filter (31, 31A) and the second filter (32, 32A) includes a decimation filter.

This aspect contributes to increasing the accuracy of digital conversion.

In a digital filter (3) according to a third aspect, which may be implemented in conjunction with the first or second aspect, the first filter (31A) and the second filter (32A) are connected in series, and the second filter (32A) is arranged to precede the first filter (31A).

According to this aspect, the second filter (32A) performs primary filter processing and the first filter (31A) performs secondary filter processing, thus contributing to reducing the size of the first filter (31A).

In a digital filter (3) according to a fourth aspect, which may be implemented in conjunction with the third aspect, the first filter (31A) performs further filter processing on the second digital data that the second filter (32A) has output.

According to this aspect, the second filter (32A) performs primary filter processing and the first filter (31A) performs secondary filter processing, thus contributing to reducing the size of the first filter (31A).

In a digital filter (3) according to a fifth aspect, which may be implemented in conjunction with any one of the first to fourth aspects, the second digital data is high-order bits of the first digital data.

This aspect allows outputting first digital data and second digital data having different accuracies.

A digital filter (3) according to a sixth aspect, which may be implemented in conjunction with any one of the first to fifth aspects, further includes a third filter (33, 33A) to perform filter processing on the output of the A/D conversion unit (2).

This aspect allows third digital data to be generated separately from the first digital data and the second digital data.

An A/D converter (1) according to a seventh aspect includes: the digital filter (3) according to any one of the first to sixth aspects; and the A/D conversion unit (2).

This aspect allows the digital filter (3) to provide output data with higher accuracy and lower latency.

In an A/D converter (1) according to an eighth aspect, which may be implemented in conjunction with the seventh aspect, the A/D conversion unit (2) includes: a ΔΣ A/D converter; and a successive approximation register A/D converter (second A/D converter 22) arranged to precede the ΔΣ A/D converter.

This aspect allows the output data of the A/D converter (1) to have lower latency.

A sensor processing circuit (10) according to a ninth aspect includes the A/D converter (1) according to the seventh or eighth aspect. The A/D converter (1) converts output of a sensor (101) into digital data and outputs the digital data to a control circuit (200).

This aspect allows the digital filter (3) included in the A/D converter (1) to provide output data with higher accuracy and lower latency.

A sensor system (100) according to a tenth aspect includes: the sensor processing circuit (10) according to the ninth aspect; and the sensor (101).

This aspect allows the digital filter (3) included in the A/D converter (1) of the sensor processing circuit (10) to provide output data with higher accuracy and lower latency.

REFERENCE SIGNS LIST

1 A/D Converter
2 A/D Conversion Unit
21 (First) A/D Converter (A/A/D Converter)
22 Second A/D Converter (Successive Approximation Register A/D Converter)
3 Digital Filter
31, 31A First Filter
32, 32A Second Filter
33, 33A Third Filter
42 Output Unit
10 Sensor Processing Circuit
100 Sensor System
101 Sensor
200 Control Circuit

The invention claimed is:

1. A digital filter for use in an A/D converter, the digital filter comprising:
  a first filter configured to output first digital data by performing filter processing on output of an A/D conversion unit included in the A/D converter; and
  a second filter configured to output second digital data by performing filter processing on the output of the A/D conversion unit, the second digital data having either a lower resolution or a smaller effective number of bits than the first digital data does,
  the second filter being configured to output the second digital data outside the A/D converter before the first filter outputs the first digital data outside the A/D converter.

2. The digital filter of claim 1, wherein
the A/D conversion unit includes a ΔΣ A/D converter, and each of the first filter and the second filter includes a decimation filter.

3. The digital filter of claim 1, wherein
the first filter and the second filter are connected in series, and
the second filter is arranged to precede the first filter.

4. The digital filter of claim 3, wherein the first filter is configured to perform further filter processing on the second digital data that the second filter has output.

5. The digital filter of claim 1, wherein the second digital data is high-order bits of the first digital data.

6. The digital filter of claim 1, further comprising a third filter configured to perform filter processing on the output of the A/D conversion unit.

7. An A/D converter comprising:
  the digital filter of claim 1; and
  the A/D conversion unit.

8. The A/D converter of claim 7, wherein the A/D conversion unit includes: a ΔΣ A/D converter; and a successive approximation register A/D converter arranged to precede the ΔΣ A/D converter.

9. A sensor processing circuit comprising the A/D converter of claim 7, wherein the A/D converter is configured to convert output of a sensor into digital data and output the digital data to a control circuit.

10. A sensor system comprising:
  the sensor processing circuit of claim 9; and
  the sensor.

* * * * *